(12) United States Patent
Haggard et al.

(10) Patent No.: US 6,168,026 B1
(45) Date of Patent: Jan. 2, 2001

(54) COMPONENT CARRIER HAVING HIGH STRENGTH POCKET

(75) Inventors: Clifton C. Haggard; James R. Thomas, both of Austin, TX (US); Qifang Yang, Handan (CN); Zhong Ru Wang, Hefei (CN); Jing Xiao, Shanghe (CN); Liansheng Wei, Hangzhou (CN); Jaime S. Villaflor, Laguna (PH); Gang Wang, Shenzhen (CN)

(73) Assignee: Paek International, Inc., Austin, TX (US)

( * ) Notice: Under 35 U.S.C. 154(b), the term of this patent shall be extended for 0 days.

(21) Appl. No.: 09/395,946

(22) Filed: Sep. 14, 1999

Related U.S. Application Data

(62) Division of application No. 08/842,449, filed on Apr. 24, 1997, now Pat. No. 6,016,917.

(51) Int. Cl.⁷ .................................................. B65D 85/00
(52) U.S. Cl. ........................................... 206/714; 206/725
(58) Field of Search .................................... 206/713, 714, 206/716, 725, 330, 332

(56) References Cited

U.S. PATENT DOCUMENTS

| | | |
|---|---|---|
| 2,858,224 | 10/1958 | Darrah . |
| 3,994,394 | 11/1976 | McRostie et al. ................. 206/714 |
| 4,889,239 | 12/1989 | Sandish et al. . |
| 4,966,281 | 10/1990 | Kawanishi et al. . |
| 5,076,427 | 12/1991 | Thomson et al. . |
| 5,152,393 | 10/1992 | Chenoweth . |
| 5,234,104 | 8/1993 | Schulte et al. ................. 206/714 |
| 5,265,723 | 11/1993 | Chenoweth et al. . |
| 5,396,988 | 3/1995 | Skrtic . |
| 5,526,936 | 6/1996 | Matsuzoe . |
| 5,664,680 | 9/1997 | Hamlin . |
| 6,016,917 | * 1/2000 | Haggard et al. ................. 206/714 |

FOREIGN PATENT DOCUMENTS

| | | |
|---|---|---|
| 1-94267 | 6/1989 | (JP) . |
| 2-48572 | 4/1990 | (JP) . |
| 2-219761 | 9/1990 | (JP) . |
| 2-258573 | 10/1990 | (JP) . |
| 3-133762 | 6/1991 | (JP) . |
| 4-10067 | 1/1992 | (JP) . |
| 4-267764 | 9/1992 | (JP) ................................ 206/330 |
| 5-61088 | 8/1993 | (JP) . |
| 5-77075 | 10/1993 | (JP) . |
| 6-263164 | 9/1994 | (JP) . |
| 7-11567 | 2/1995 | (JP) . |
| 7-45734 | 2/1995 | (JP) . |
| 7-149393 | 6/1995 | (JP) . |
| 7-165259 | 6/1995 | (JP) . |
| 7-165260 | 6/1995 | (JP) . |
| 7-291345 | 11/1995 | (JP) . |
| 8-198317 | 8/1996 | (JP) . |
| 8-198318 | 8/1996 | (JP) . |
| 9-66990 | 3/1997 | (JP) . |

* cited by examiner

Primary Examiner—Bryon P. Gehman
(74) Attorney, Agent, or Firm—Fitzpatrick, Cella, Harper & Scinto

(57) ABSTRACT

A component carrier for holding a component includes a carrier substrate and a pocket recessed in the substrate for holding the component in its interior. The pocket has a wall and a floor, and the wall includes a series of elongated arcuate channels. The channels are concave relative to the pocket interior and extend substantially perpendicular to the pocket floor. The wall is substantially flat between the channels. A substantially continuous pedestal projects from the pocket floor. The pedestal has (i) an upper surface for supporting the component, (ii) a pair of support walls extending from the pocket floor and terminating in the support surface, and (iii) a notched portion intermediate the pedestal and defined by a lateral support member extending between the support walls and spaced from the pocket floor, for absorbing lateral components of compressive forces applied to the pedestal.

40 Claims, 6 Drawing Sheets

COMPONENT CARRIER HAVING HIGH STRENGTH POCKET

This is a divisional of application Ser. No. 08/842,449, filed Apr. 24, 1997, now U.S. Pat. No. 6,016,917.

FIELD OF THE INVENTION

This invention relates to component carrier tape or trays, and more particularly to an improved carrier tape or tray pocket with increased pocket and pedestal strength.

BACKGROUND OF THE INVENTION

Analog and digital circuits are used in countless varied applications, and are being integrated even more with each passing year. Prefabricated components and chips lie at the heart of most of these circuits. As these circuits have become not only more prevalent but also more complex, it has become increasingly important to those who manufacture and sell the component parts, as well as to those who purchase components and implement circuits using them, that secure and efficient methods be available to package and transport these often delicate or sensitive components. In addition, similar demands exist with respect to other electrical and mechanical components. Component suppliers traditionally ship their parts to the end user in various forms of transport packaging, the most popular being waffle trays or tape-and-reel arrangements. In tape-and-reel arrangements, the tape is thermoformed with a series of pockets formed along its length. A component part is inserted into a pocket and covered with a cover tape which secures the part inside. The cover tape is usually a film or web with a thermally-activated or pressure-sensitive adhesive deposited on its underside. A length of the carrier/cover tape combination is then spooled onto a circular shipping reel. This system provides an efficient arrangement in which the components can be packaged, shipped and presented to an automated assembly process.

Waffle trays are similar, except the pockets are provided in a grid pattern on a thermoformed tray. Instead of rolling the carrier onto a reel as with the tape, the trays are stacked for shipping and storage.

Circuit components are generally formed of a main body with terminals extending from near the edges of the main body. The main body is generally more robust than the terminals, and able to withstand forces typically encountered in shipping and storage. The terminals, however, are often quite delicate, and therefore, cause the most concern in shipping and storage. Any impact between a terminal and the interior of the carrier tape pocket, for example, can be potentially damaging to the component. Therefore, it is desirable to separate the component terminals from the inner surfaces of the pocket and to maintain that separation. To create the separation, a typical pocket includes a "pedestal" that holds the component off the bottom surface of the pocket. To maintain the separation, the pocket and pedestal must resist crushing during typical shipping and storage conditions.

The carrier is generally formed of a thin layer of thermoplastic, typically less than a millimeter thick. Because the pocket walls are so thin, the pockets are susceptible to being crushed when spooled onto a reel or stacked for shipping. The formation of the recessed pocket stretches the material even thinner in the side walls of the pocket, further reducing the strength of the pocket. Conventional efforts to increase the crush resistance of carrier pockets have centered around increasing wall thicknesses or changing the material. Unfortunately, increased thicknesses result in proportionate increases in shipping weight and cost, as well decreases in component capacity. Further, stronger materials are generally more expensive and/or heavier, which also increases production and shipping costs. Many tapes and trays have been fashioned from either high strength plastic or laminates of various plastics. These materials are more expensive than standard plastics, but do not significantly improve the overall pocket strength when used in typical industry thickness ranges.

In certain applications, it is desirable that the packaging materials conduct electricity or dissipate static in order to protect the component from electrostatic damage. In these cases, the resin from which the carrier is formed is generally impregnated with a carbon powder or the like. The presence of the carbon powder, however, tends to degrade the structural integrity of the plastic, and the design of a conductive carrier pocket must take into account the resultant loss of strength.

Some carrier manufacturers compensate for the resultant loss of strength by providing a laminate structure in which a more pure plastic structural layer is sandwiched between two thin carbon-impregnated layers. This approach does provide added strength, but has several drawbacks in addition to the increased production costs generally involved with producing such a laminate. The conductive qualities of the laminates are generally inferior. Further, the thin conductive layer can be stretched too thin in the forming process or scratched off the structural layer in use, either of which can diminish the electrostatic protection desired. Also, the three-layer structure under certain conditions, can store charge like a capacitor. Therefore, it is preferable to provide a single conductive layer and compensate for the reduced strength of the material in other ways.

As for the pedestal, conventional designs extend at steep angles from the pocket bottom and provide a flat support surface on which the component rests. One disadvantage of these typical designs is that the pocket and the pedestal strength depend almost entirely on the inherent strength and rigidity of the material. Further, these pedestals often have near-vertical sides that are even more susceptible to bending, buckling, or collapsing. The typical pedestal is not very resistant to compressive forces applied to the component from above or to the pedestal from below.

Examples of known carrier tape designs are shown in U.S. Pat. No. 5,265,723, to Chenoweth et al., and U.S. Pat. No. 5,152,393, to Chenoweth, each of which illustrate microchip storage tape having pockets for accommodating electronic components. In Chenoweth (which is incorporated by reference into Chenoweth et al.), a bottom wall has a plurality of linear, upwardly-projected, V-shaped ridges, the inclined inner surfaces of which lie at the edges of a center portion of the pocket and serve to keep the microchip centered. Rectangular, raised support shoulders with substantially parallel, vertical walls, extend diagonally across the corners of the center portion of the pocket between adjacent ends of the ridges. The shoulders, which are lower than the ridges, support the microchip, elevated above the bottom wall, with its leads extending over the ridges so that the leads do not engage the bottom wall or the ridges. While this pedestal arrangement serves well its intended purpose, maintaining the microchip in position in the center of the pocket, it does not account for the particular concerns addressed by the present invention.

Another example, U.S. Pat. No. 4,966,281, to Kawanishi et al., relates to an electronic component carrier tape with a number of cavities. In FIGS. 8a and 8b of this patent, the surface of a "valley" (between a "component-mounting portion" and a peripheral wall) of the cavity is corrugated with an angular pattern. Because the electronic component is bonded to the component-mounting portion, when the component is to be removed, bending strain will develop in the valley portion. The corrugations distribute this strain, increasing the resistance to bending. While the squared corrugations of this arrangement do somewhat improve the rigidity of the peripheral wall, stress can be concentrated by the corners of the corrugations themselves, which become points of potential failure.

Japanese Laid-Open Patent Application No. 8-198317, of Sakurai, and Japanese Laid-Open Patent Application No. 7-149393, of Takahashi, illustrate other examples of component carrier tape pockets with side walls reinforced by corrugation or patterning. U.S. Pat. No. 5,396,988, to Skrtic, illustrates a buttressed carrier tape pocket side wall, whereas U.S. Pat. No. 4,889,239, to Sandish et al., and U.S. Pat. No. 2,858,224, to Darrah, illustrate examples of other containers with side walls reinforced by corrugations or the like.

Rounded, as compared to squared, corrugations provide better stability by eliminating corners in which stress can be focused. However, if a flat component lead does contact the rounded inner surfaces of such a corrugation, the region of contact will be more focused than it would be with a flat wall, increasing the likelihood of damaging the component.

Thus, there is a need in the art for a component carrier pocket with a pedestal designed to better resist compression.

There is a further need for a component carrier with side walls designed to better resist compression.

There is also a need for a component carrier with side walls that resist compression but include regions that distribute impacts of the component leads.

There is an additional need for a component carrier incorporating each of these features, wherein the pedestal and the pocket side walls better resist compression, and the side walls include regions that distribute component impacts.

SUMMARY OF THE INVENTION

Accordingly, one aspect of the present invention relates to a component carrier, for holding a component, including a carrier substrate. A pocket is recessed in the substrate for holding the component in its interior. The pocket has a wall and a floor, and includes a series of elongated arcuate channels. The channels are concave relative to the pocket interior and extend substantially perpendicular to the pocket floor. The wall is substantially flat between the channels. A substantially continuous pedestal projects from the pocket floor, and has an upper surface for supporting the component and a pair of support walls extending from the pocket floor and terminating in the support surface. A notched portion is intermediate the pedestal and is defined by a lateral support member, extending between the support walls and spaced from the pocket floor, for absorbing lateral components of compressive forces applied to the pedestal.

The upper surface can be substantially parallel to the pocket floor. In one embodiment, the support walls can be substantially flat and disposed substantially at an angle of between 30° and 80° relative to the pocket floor, wherein the angle can preferably be approximately 65°. In another embodiment the support walls can be arcuate.

The pedestal can form a closed loop, and the notched portion can include a plurality of similar notched portions arranged about the pedestal. More specifically, the pedestal can be substantially annular, and the notched portion can include a plurality of similar notched portions arranged substantially equidistantly about the pedestal.

The lateral support member can include a transverse support surface and a notch wall extending from the transverse support surface to the upper surface of the pedestal. The transverse support surface can be substantially parallel to the pocket floor.

Various embodiments include a continuous transition between the transverse support surface and the notch wall, or the notch wall can include a plurality of facets disposed at angles to one another, or the notch wall can be conic, or the transverse support surface can include a plurality of facets disposed at angles toward one another. In the last embodiment, two of the transverse support surface facets can interface parallel to the upper surface. According to another embodiment, the transverse support surface can be arched transversely so as to be convex relative to the pocket interior. Alternatively, the notch wall can be disposed at an angle of between approximately 30° and 80° relative to the upper surface, with the angle preferably being approximately 60°. In another embodiment, the notched portion can be saddle shaped.

In another aspect, the pocket can further include a pocket wall which includes a series of elongated arcuate channels, the channels being concave relative to the pocket interior and extending substantially perpendicular to the pocket floor. The wall is substantially flat between the channels. In this embodiment, the channels can extend substantially from the pocket floor to the substrate.

The carrier can be a tape, which is spooled, or a tray, which is stacked, for shipping and storage.

The objects, features and advantages of the present invention will be better understood with reference to the following drawings, in which like or corresponding reference numbers refer to like or corresponding elements throughout the views.

DETAILED DESCRIPTION OF THE PREFERRED EMBODIMENT

Figure 1A:
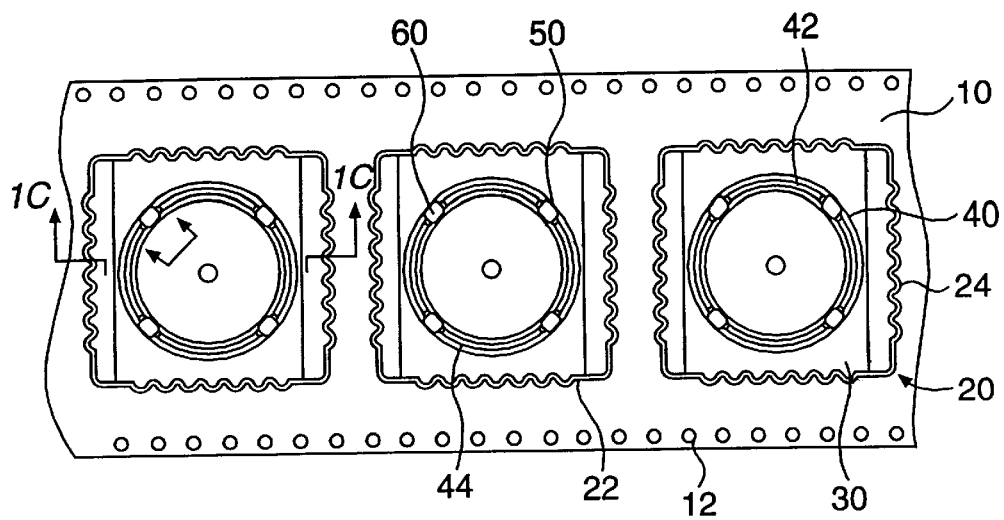
FIG. 1A is a top plan view of a carrier tape including a carrier pocket of an embodiment of the present invention.
Figure 1B:
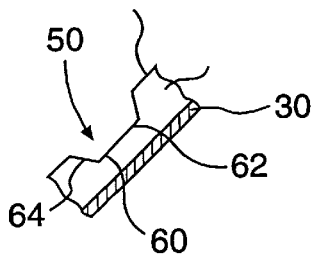
FIG. 1B is a partial cross-sectional side view of an element of the pocket shown in FIG. 1A.
Figure 1C:
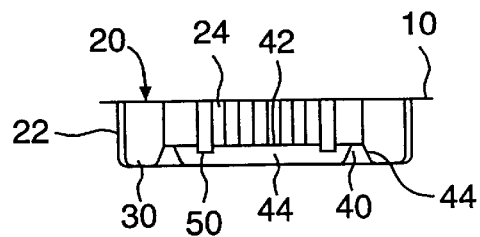
FIG. 1C is another partial cross-sectional side view of an element of the pocket shown in FIG. 1A.

FIGS. 1A through 1C show an embodiment of the carrier pocket of the present invention in the context of a carrier tape, but the following discussion will apply equally to carrier trays as well. This figure shows a tape substrate 10 which includes a pocket 20 formed therein. The pocket 20 can be formed by, for example, thermoforming, pressing, hot-stamping or punching. Extending up from a floor 30 of the pocket 20 is a pedestal 40 for supporting components (not shown) above the floor of the pocket.

The tape substrate 10 is generally a formable, flexible material which possesses sufficient material strength to serve its intended purpose. Generally, substrate 10 is formed of a thermoformable thermoplastic, such as polystyrene, polyvinyl chloride, polyethylene terepthalate, polycarbonate, or a laminate structure including one or more of the above. As discussed above, in some applications, it is preferable to provide a material with static dissipative or electrically conductive properties in order to electrostatically protect the component. In the preferred embodiment, the substrate 10 is formed of a conductive polystyrene, which is relatively inexpensive and possesses satisfactory material properties for this application.

The size and depth of pocket 20 dictate the thickness of the substrate 10. The substrate must be thick enough to permit the pocket to be formed. The pocket can be thermoformed, for example, by applying well known techniques essentially to stretch the material from a flat substrate. On the other hand, the substrate should be as thin as possible to minimize the weight and bulk of the carrier, which directly impact shipping and storage costs. However, the substrate 10 cannot be so thin as to completely compromise its strength. Each of these considerations is material-dependent. With conductive polystyrene, substrate thicknesses are generally approximately 0.2 millimeters or greater.

A series of sprocket holes 12 is disposed along either edge of the tape. These are provided so that automated machinery can feed the tape to load and unload components from the pockets. The holes 12 are spaced approximately 4 millimeters apart, which is an industry standard. However, this distance can be varied, if desired.

As for the pockets 20, the component (not shown), carried therein generally dictates its specific size and shape. The shape can be square, rectangular, rounded, or any of an infinite variety of shapes and dimensions.

The lateral boundaries of the pocket are defined by pocket walls 22. If the pocket 20 is circular, oval or any other rounded shape, the pocket wall 22 will essentially be singular and continuous.

A series of vertically oriented, rounded corrugations 24 can be disposed in the pocket walls 22, extending substantially from the pocket floor 30 to the substrate 10. Here "vertically oriented" refers to the orientation of the corrugations relative to the pocket itself, in which the pocket floor 30 is considered to be at the bottom. These corrugations contribute greatly to the compressive strength of the pocket. In comparative tests, pockets with this corrugation pattern have been measured against otherwise similar pockets having standard, flat walls. On average, the pockets having the shown corrugations can withstand approximately twice the compressive force before crushing.

The pedestal 40 in this embodiment is an annular or "ring" pedestal. It has an upper surface 42 to support a component. Support walls 44 extend from the pocket floor 30 and terminate in the upper surface 42. FIG. 1C, a cross-sectional side view taken along the line 1C—1C in FIG. 1A, shows this best. The term "upper" is also used relative to the pocket.

The upper surface 42 is generally narrow, and the support walls can be angled or arched, or both. The upper surface and the support walls can be substantially continuous as in a half-split tubular configuration. Here, the support walls 44 are substantially flat, each forming an angle of approximately 65° with the pocket floor 30. This angle can vary, but is preferably between approximately 30 and 80°. In this embodiment, the upper surface 42 is a slightly rounded peak.

At least one notched portion 50 (or "notch") is provided in the pedestal 40. Each notched portion 50 defines a gap in the upper surface which extends partially to the pocket floor 30. Within each notched portion 50, a lateral support surface 60 spans between the support walls 44 transversely across the pedestal 40. This transverse connection provides lateral support, which adds to the stability of the pedestal. The lateral support surface 60 resists lateral deflection of the support walls 44 as compressive forces are applied to the pedestal, which helps to prevent buckling. The notched portion 50 can best be seen in FIG. 1B, a cross-sectional view taken in the direction of arrow 1B—1B in FIG. 1A.

The notched portion 50 is preferably located intermediate, as opposed to at an end, of a continuous length of pedestal. This intermediate location is where buckling is most likely to occur, and where there is less support from neighboring structure.

While it is not necessary that the pedestal be annular, it is preferred that the pedestal 40 on either side of each notched portion 50 be substantially continuous, i.e., not disjointed. It is most preferable that the pedestal 40 on each side of the notched portion 50 fit substantially to a continuous geometric curve such as a line or an arc of a circle. This minimizes stress concentrations and takes full advantage of the beneficial effects of the notched portion 50.

If the pedestal includes substantially linear spans, the notched portions should be disposed intermediate the spans, not at the intersections of the spans. This is in contrast to pockets in the art which employ disjointed pedestals with short, rectangular segments disposed at angles to and connecting the ends of tall, peaked segments.

In this embodiment, four notched portions are distributed more or less evenly around the ring pedestal. Also, the upper surface 42 conforms substantially to a circle.

FIG. 1B shows that the lateral support surface 60 includes a transverse support surface 62, which is substantially parallel to the upper surface 42 and to the pocket floor 30, approximately midway up the support walls 44 to define a floor of the notch. A pair of notch walls 64 extend at approximately 60° from the transverse support surface 62 to the upper surface 42. The notch walls 64 can be disposed at any of a number of angles, preferably between approximately 30 and 80°. The angle contributes to the distribution of stress at the notched portion 50. In this embodiment, the notch portion 50 is more or less symmetric about a plane bisecting the notched portion perpendicular to the pedestal 40. This is preferred, but is not necessary, as the notched portion 50 can be slanted relative to the pedestal 40.

Comparative tests reveal the extent to which the notched portions 50 contribute to the overall strength of the pedestal 40. The compressive strength of the pedestal 40 of the present invention was tested against a comparison pedestal. The pedestals were similar in every respect, except that the comparison pedestal did not include notched portions. Using an Instron 5568 machine to compress the pedestals at a rate of 0.5 millimeters per minute, the compressive forces necessary to crush the pedestals were determined. Three pedestals of each configuration, each having a 69.9 millimeter circumference, were tested, and the results were averaged. The notchless comparison pedestal failed at a compressive force of approximately 303 Newtons. The pedestal of the present invention did not yield until the force reached approximately 398 Newtons, an increase of almost one-third over the comparison pedestal.

Figure 2:
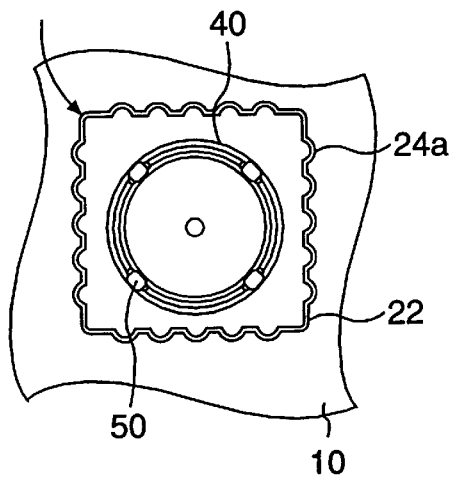
FIG. 2 is a top plan view of a carrier pocket of another embodiment of the present invention.

FIG. 2 illustrates another embodiment of the carrier pocket of our invention. The pedestal 40 is substantially the same as that discussed above. The wall corrugations 24a, however, are different. Here, the corrugations 24a are rounded, but are only disposed on the outside of the pocket walls 22 so as to be concave relative to the pocket interior. The pocket walls 22 are otherwise substantially flat. The pocket walls 22 will not, and need not, be perfectly flat in the case of a rounded or irregularly shaped pocket. However, they should be substantially flat in comparison to the curvature of the corrugations. The corrugations 24a are rounded to provide better resistance to buckling under compressive forces because a rounded corrugation contains fewer stress concentration points as compared to a squared corrugation. The pocket walls are otherwise substantially flat, at least locally, in order to create a flatter contact surface for the component (not shown). A relatively flat surface, as compared to a convex one, better distributes any impact between a component terminal and the pocket wall 22, reducing the likelihood of damage to the component terminal.

More specifically, we prefer that the corrugations be configured as half cylinders. However, this is not always permitted by space or material limitations. Sufficient space needs to be provided around the pocket to allow the cover tape to be sealed to the substrate to close the pocket, and also to permit the sprocket holes to be formed. Also, certain applications demand a certain "pitch", or amount of space between the pockets. A particular pitch in combination with a particular pocket size might not allow the formation of half-cylindrical corrugations. In addition, larger or deeper pockets leave less material for the formation of perfectly half-cylindrical corrugations. The radius, spacing, and number of corrugations are dictated by similar considerations to those discussed above, i.e., the pocket dimensions, spacing, and the material thickness.

Other shapes besides half cylinders are acceptable, including a taper in which each corrugation reduces to a point at the floor of the pocket. From a stability standpoint, it would be preferable to use an inverse taper, wherein the corrugations were largest at the pocket floor. However, this shape is very difficult to manufacture, such as by thermoforming. To facilitate removal of the pocket mold after formation, for example, the corrugations may be provided with a slight taper so as to narrow from top to bottom.

In the embodiment shown, and by way of example, the tape substrate 10 is approximately 0.4 millimeters thick, and the tape approximately 44 millimeters across. The pockets are approximately 26 millimeters square and 5½ millimeters deep. The distance from the center of one pocket to the center of the next is approximately 32 millimeters. The radius of the corrugations are approximately 0.6 millimeter or approximately twice the thickness of the wall 22 which has been stretched thinner in thermoforming. The corrugations are spaced five to a side, with slightly more space allowed near the corners than between neighboring corrugations. This provides a flat wall near the corners where the terminal leads are more likely to impact. The corrugations themselves are tapered at between 2 and 3° relative to parallel of course, other dimensions and angular relationships can be used as desired.

Figure 3A:
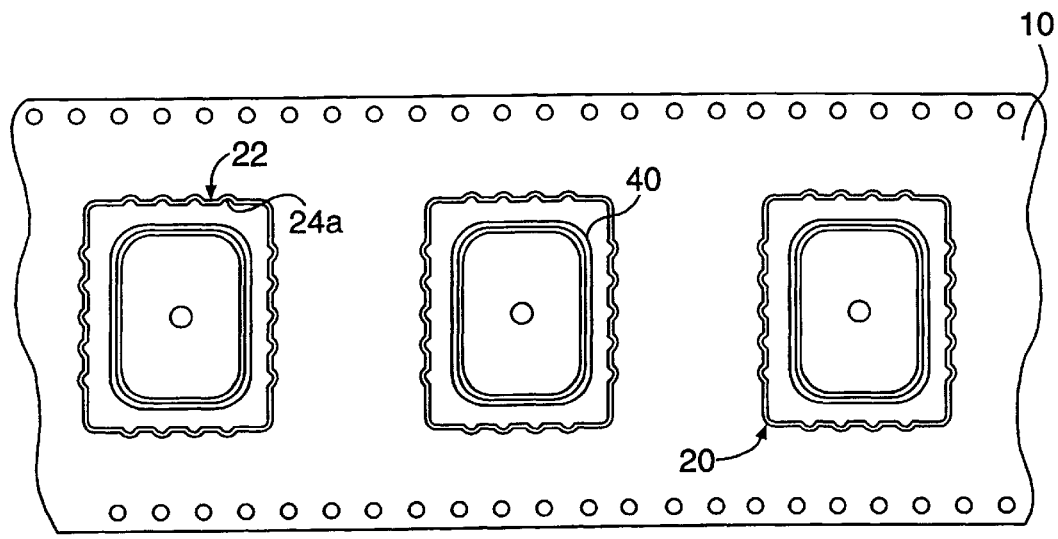
FIG. 3A is a top plan view of a carrier tape including a carrier pocket of another embodiment of the present invention.
Figure 3B:
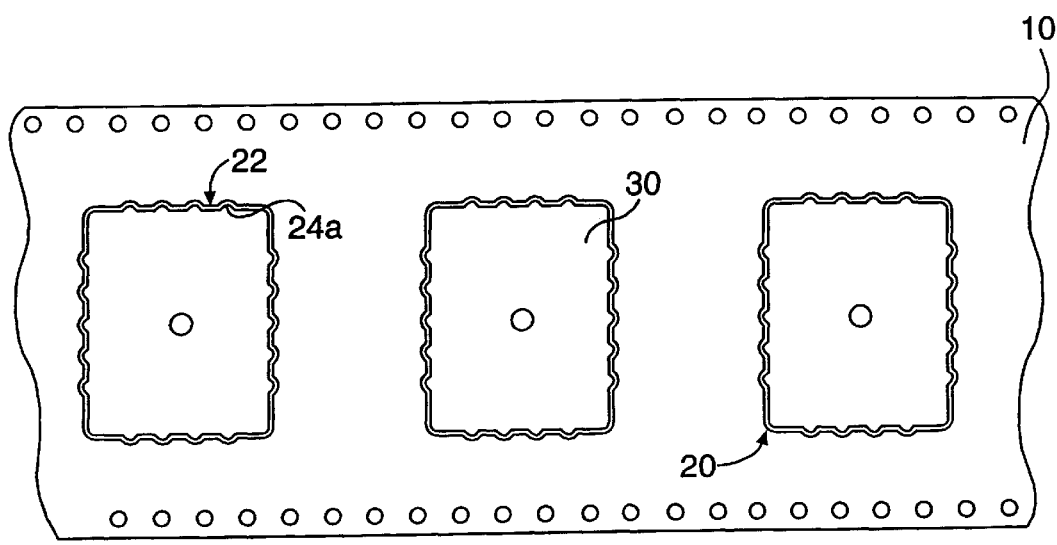
FIG. 3B is a top plan view of a carrier tape including a carrier pocket of another embodiment of the present invention.
Figure 3C:
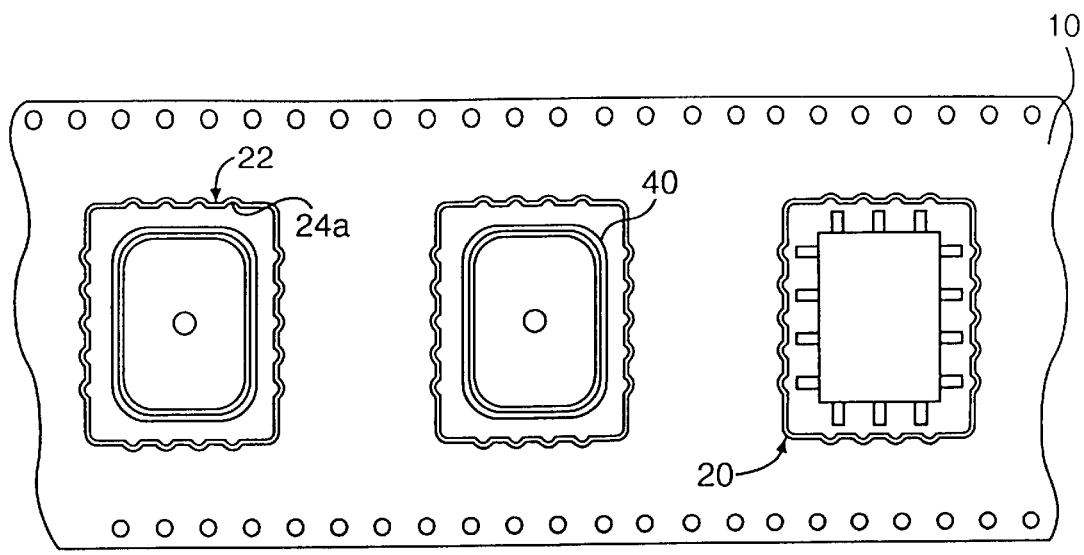
FIGS. 3C and 3D illustrate the carriers of FIGS. 3A and 3B, respectively, after a component has been inserted into one of the pockets thereof.
Figure 3D:
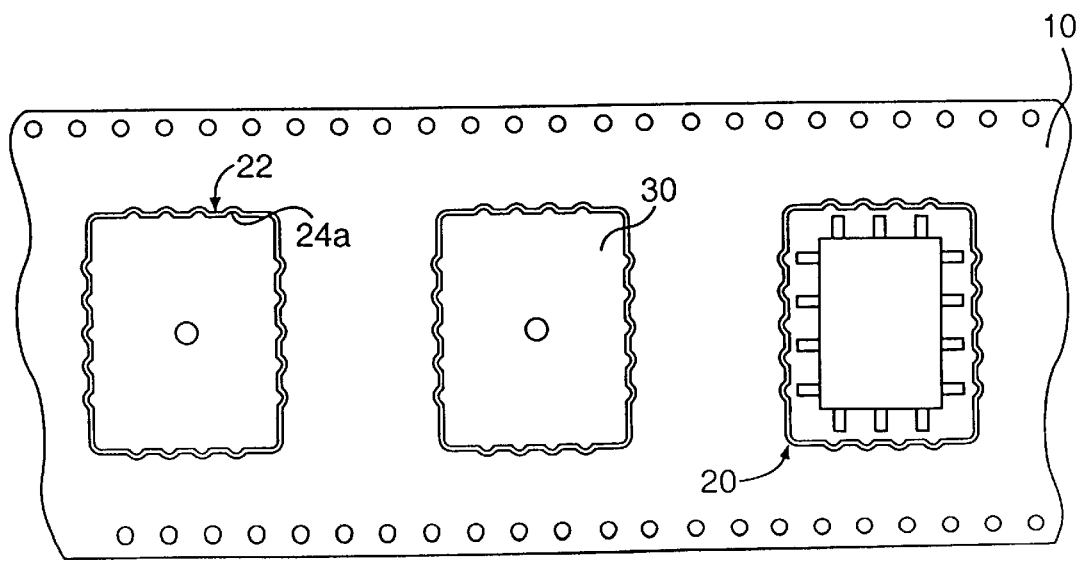

FIG. 3A illustrates another embodiment of the present invention, which employs a similar corrugation pattern to 24a the one discussed with reference to FIG. 2, but includes a standard "race track" pedestal 40' with a substantially uniform cross section. In fact, this corrugation pattern could be used in a pocket with no pedestal at all, as shown in FIG. 3B. This arrangement is useful with components that, due to their particular configurations, do not need to be elevated from the pocket floor 30. FIGS. 3C and 3D illustrate the carriers of FIGS. 3A and 3B, respectively, after a component has been inserted into one of the pockets thereof.

Figure 4:
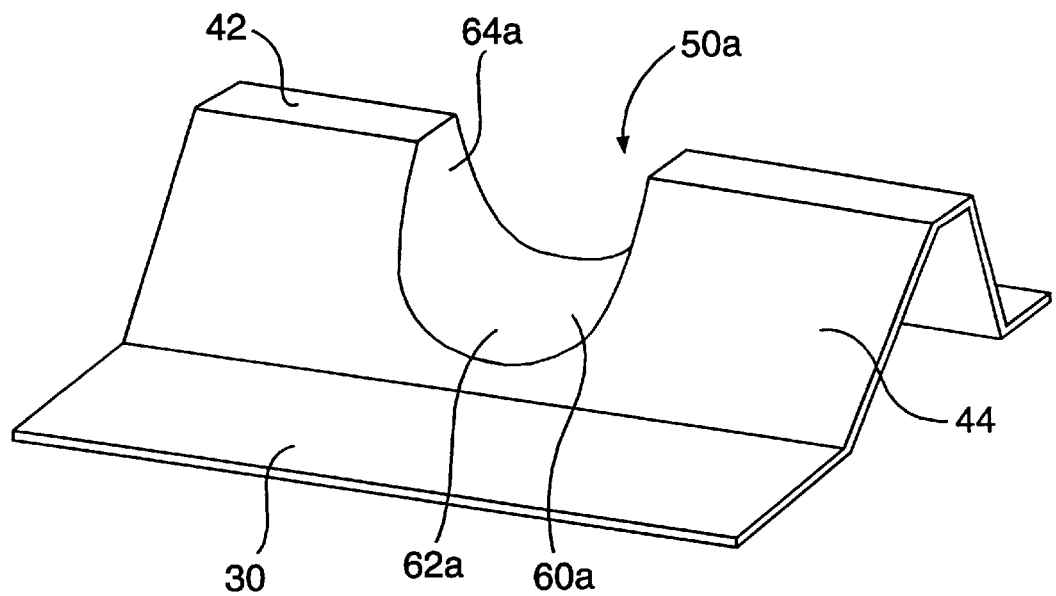
FIG. 4 is a partial cutaway, perspective view of a pedestal of a carrier pocket of another embodiment of the present invention.

FIGS. 4 through 10 show partial cutaway, perspective views of various embodiments of the pedestal of our invention, which include various notch and wall configurations. FIG. 4 shows the curved, notched portion 50a with a smooth, continuous lateral support surface 60a, i.e., having no discernable transition between the transverse support surface 62a and the notch walls 64a. This configuration eliminates edges, which act as stress concentrations.

Figure 5:
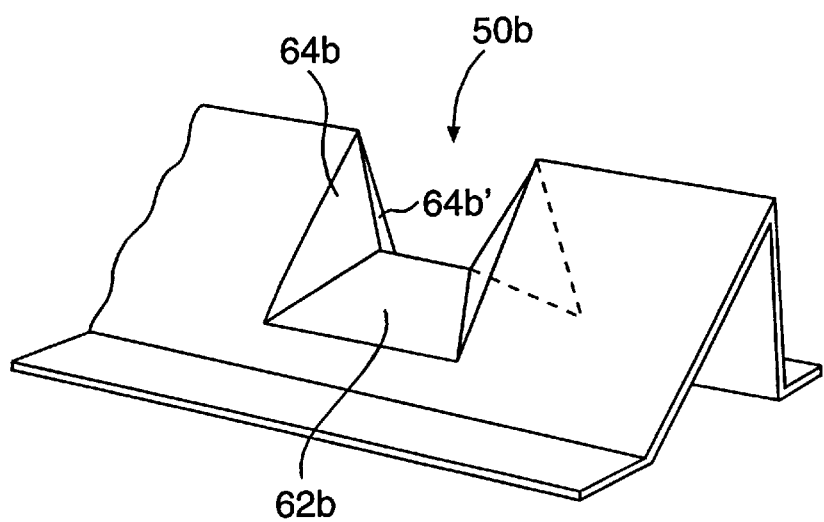
FIG. 5 is a partial cutaway, perspective view of a pedestal of a carrier pocket of another embodiment of the present invention.
Figure 6:
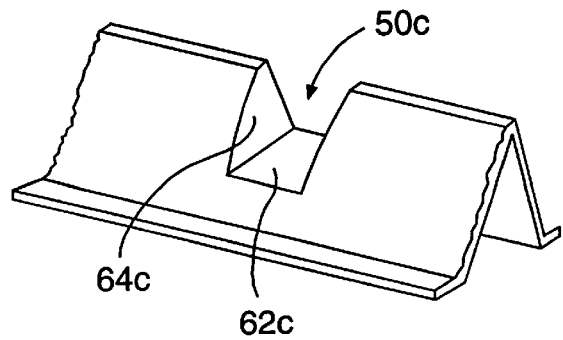
FIG. 6 is a partial cutaway, perspective view of a pedestal of a carrier pocket of another embodiment of the present invention.

FIG. 5 shows a notched portion 50b with multi-faceted transverse support walls 62b and notch wall 64b, 64b' in which the intersection of the facets is substantially parallel to the upper surface 42, and FIG. 6 shows a notched portion 50c with near vertical notch walls 64c.

Figure 7:
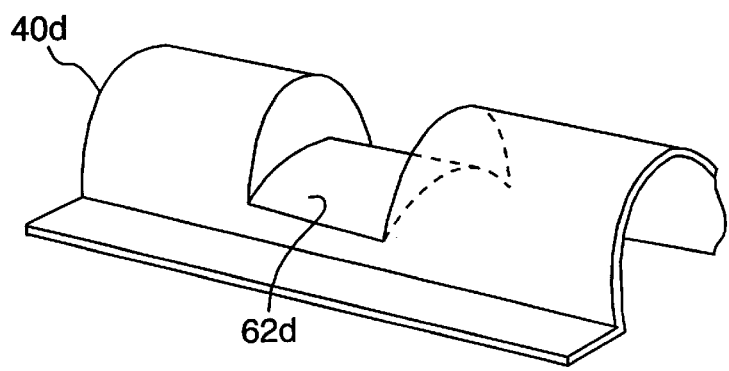
FIG. 7 is a partial cutaway, perspective view of a pedestal of a carrier pocket of another embodiment of the present invention.

FIG. 7 shows a substantially arched pedestal 40d. This embodiment includes an arcuate transverse support wall 62d. The traverse support wall may alternately be substantially flat with this pedestal 40d. The arched pedestal 40d requires more space than an inverted-V configuration, but takes advantage of the inherent structural strength of an arch.

Figure 8:
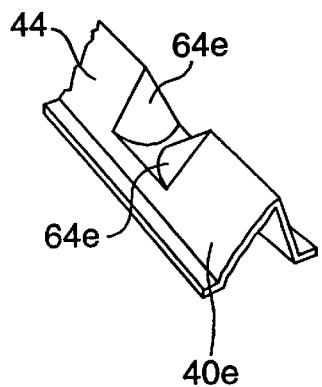
FIG. 8 is a partial cutaway, perspective view of a pedestal of a carrier pocket of another embodiment of the present invention.

FIG. 8 shows a pedestal 40e with conically configured notch walls 64e. This conic configuration reduces the severity of the angles between the support walls 44 and the notch walls 64e, which leads to a reduction in stress concentration at the junctions. Further, the conic shape possesses inherent structural benefits.

Figure 9:
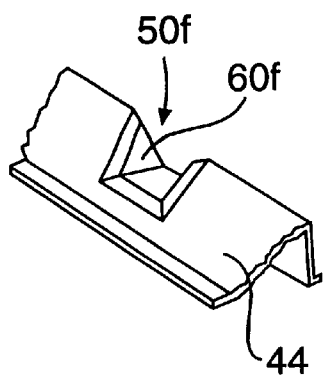
FIG. 9 is a partial cutaway, perspective view of a pedestal of a carrier pocket of another embodiment of the present invention.

FIG. 9 shows a notch portion 50f with a beveled transition between the lateral support surface 60f and the support walls 44. The bevels, similar to the conic configuration shown in FIG. 8, reduce the severity of the angles between the lateral support surface 60f and the support walls 44.

Figure 10:
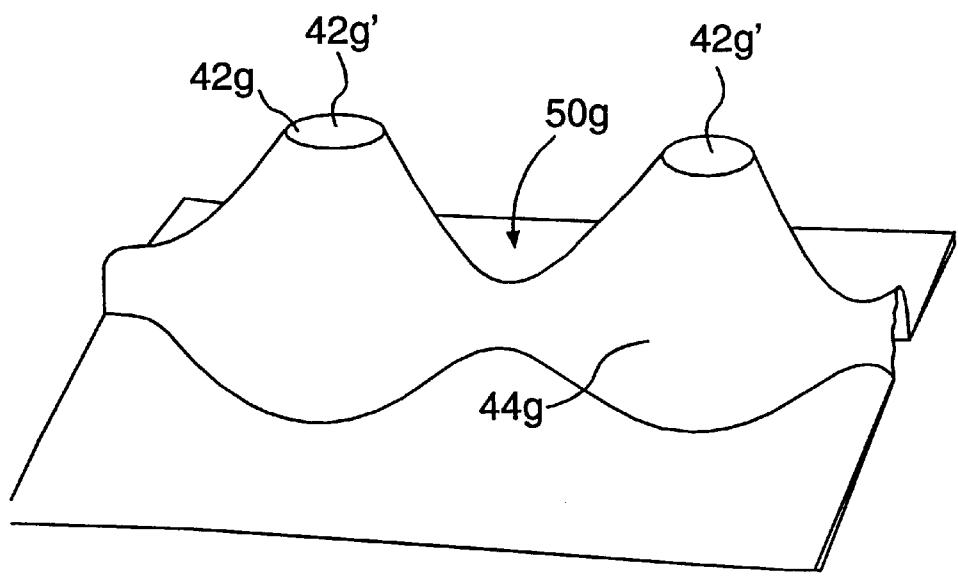
FIG. 10 is a partial cutaway, perspective view of a pedestal of a carrier pocket of another embodiment of the present invention.

FIG. 10 shows another embodiment of our invention, in which the upper surface 42g includes a series of rounded contact areas 42g', supported by smooth support walls 44g which form substantially conic supports. In this embodiment, the notched portion 50 is saddle-shaped. This embodiment is particularly well suited for providing an array of contact areas 42g' for use with components commonly called "grid array" packages, in which the component leads are disposed in an array on the bottom of the components, as opposed to extending from the sides of the component.

Although specific embodiments of the present invention have been described above in detail, it will be understood that this description is merely for purposes of illustration. Various modifications of and equivalent structures corresponding to the disclosed aspects of the preferred embodiments in addition to those described above may be made by those skilled in the art without departing from the spirit of the present invention, which is defined in the following claims.

We claim:

1. A component carrier for holding an integrated circuit chip that has a main body and terminals extending from the main body, the carrier comprising:
   a substrate;
   a pocket recessed in the substrate for holding the chip in the interior of the pocket, the pocket having a wall and a floor, the wall including a series of elongated arcuate channels, the channels being concave relative to the pocket interior and extending substantially perpendicular to the pocket floor, the wall having between the channels substantially flat contact surfaces for directly abutting the chip when the chip is held within the pocket; and
   a pedestal projecting from the pocket floor for contacting and supporting the chip away from the pocket floor.

2. The carrier according to claim 1, wherein the channels extend substantially from the pocket floor to the substrate.

3. The carrier according to claim 1, wherein the channels have an approximately part-circular cross section.

4. The carrier according to claim 3, wherein the channels are approximately part-cylindrical.

5. The carrier according to claim 3, wherein the channels are approximately half-cylindrical.

6. The carrier according to claim 3, wherein the wall has a thickness and the channels have a cross-sectional radius of approximately twice the thickness of the wall.

7. The carrier according to claim 1, wherein the channels are tapered.

8. The carrier according to claim 7, wherein the channels are tapered so as to narrow as they approach the pocket floor.

9. The carrier according to claim 8, wherein the channels taper at an angle of approximately 2–3°, relative to parallel.

10. A component carrier for holding an integrated circuit chip that has a main body and terminals extending from the main body, the carrier comprising:
    a substrate; and
    a pocket recessed in the substrate for holding the chip in the interior of the pocket, the pocket having a wall and a floor, the wall including a series of elongated arcuate channels, the channels being concave relative to the pocket interior and extending substantially perpendicular to the floor, the wall having between the channels substantially flat contact surfaces for directly abutting the chip when the chip is held within the pocket.

11. The carrier according to claim 10, wherein the channels extend substantially from the pocket floor to the substrate.

12. The carrier according to claim 10, wherein the channels have an approximately part-circular cross section.

13. The carrier according to claim 12, wherein the channels are approximately part-cylindrical.

14. The carrier according to claim 12, wherein the channels are approximately half-cylindrical.

15. The carrier according to claim 12, wherein the wall has a thickness and the channels have a cross-sectional radius of approximately twice the thickness of the wall.

16. The carrier according to claim 10, wherein the channels are tapered.

17. The carrier according to claim 16, wherein the channels are tapered so as to narrow as they approach the pocket floor.

18. The carrier according to claim 17, wherein the channels taper at an angle of approximately 2–3°, relative to parallel.

19. A method of packaging an integrated circuit chip that has a main body and terminals extending from the main body, the method comprising the steps of:
    (a) providing a component carrier, comprising:
        (i) a substrate;
        (ii) a pocket recessed in the substrate and having a wall and a floor, the wall including a series of elongated arcuate channels, the channels being concave relative to the pocket interior and extending substantially perpendicular to the pocket floor, the wall having between the channels substantially flat contact surfaces for abutting the chip; and
        (iii) a pedestal projecting from the pocket floor; and
    (b) inserting the chip into the pocket of the carrier, where the pedestal supports the chip away from the pocket floor, and the chip is unobstructed from directly abutting the contact surfaces of the wall.

20. The method according to claim 19, wherein:
    the terminals of the chip extend laterally from the main body of the chip, and
    following the inserting step, the chip is oriented so that the pedestal contacts the main body of the chip and the terminals are in a position to abut the contact surfaces of the wall if the chip moves a distance laterally within the pocket.

21. A method of packaging an integrated circuit chip that has a main body and terminals extending from the main body, the method comprising the steps of:
    (a) providing a component carrier, comprising:
        (i) a substrate; and
        (ii) a pocket recessed in the substrate and having a wall and a floor, the wall including a series of elongated arcuate channels, the channels being concave relative to the pocket interior and extending substantially perpendicular to the floor, the wall having between the channels substantially flat contact surfaces for abutting the chip; and
    (b) inserting the chip into the pocket of the carrier, where the chip is unobstructed from directly abutting the contact surfaces of the wall.

22. The method according to claim 21, wherein:
    the terminals of the chip extend laterally from the main body of the chip, and
    following the inserting step, the chip is oriented so that the terminals are in a position to abut the contact surfaces of the wall if the chip moves a distance laterally within the pocket.

23. A component package, comprising:
    (a) a component carrier, comprising:
        (i) a substrate;
        (ii) a pocket recessed in the substrate and having a wall and a floor, the wall including a series of elongated arcuate channels, the channels being concave relative to the pocket interior and extending substantially perpendicular to the pocket floor, the wall having between the channels substantially flat contact surfaces; and
        (iii) a pedestal projecting from the pocket floor; and (b) an integrated circuit chip having a main body and terminals extending from the main body, the chip being situated in the pocket and supported away from the pocket floor by the pedestal, and the chip is unobstructed from directly abutting the contact surfaces of the wall.

24. The package according to claim 23, wherein:

the terminals of the chip extend laterally from the main body of the chip, the pedestal contacts the main body of the chip, and the terminals are positioned to abut the contact surfaces of the wall if the chip moves a distance laterally within the pocket.

25. The package according to claim 23, wherein the channels have an approximately part-circular cross section.

26. The package according to claim 25, wherein the channels are approximately part-cylindrical.

27. The package according to claim 25, wherein the channels are approximately half-cylindrical.

28. The package according to claim 25, wherein the wall has a thickness and the channels have a cross-sectional radius of approximately twice the thickness of the wall.

29. The package according to claim 25, wherein the channels are tapered.

30. The package according to claim 29, wherein the channels are tapered so as to narrow as they approach the pocket floor.

31. The package according to claim 30, wherein the channels taper at an angle of approximately 2–3°, relative to parallel.

32. A component package, comprising:

(a) a component carrier, comprising:

(i) a substrate; and (ii) a pocket recessed in the substrate and having a wall and a floor, the wall including a series of elongated arcuate channels, the channels being concave relative to the pocket interior and extending substantially perpendicular to the floor, the wall having between the channels substantially flat contact surfaces; and (b) an integrated circuit chip having a main body and terminals extending from the main body, the chip being situated in the pocket of the carrier, and the chip is unobstructed from directly abutting the contact surfaces of the wall.

33. The package according to claim 32, wherein:

the terminals of the chip extend laterally from the main body of the chip, and the terminals are positioned to abut the contact surfaces of the wall if the chip moves a distance laterally within the pocket.

34. The package according to claim 32, wherein the channels have an approximately part-circular cross section.

35. The package according to claim 34, wherein the channels are approximately part-cylindrical.

36. The package according to claim 34, wherein the channels are approximately half-cylindrical.

37. The package according to claim 34, wherein the wall has a thickness and the channels have a cross-sectional radius of approximately twice the thickness of the wall.

38. The package according to claim 32, wherein the channels are tapered.

39. The package according to claim 38, wherein the channels are tapered so as to narrow as they approach the pocket floor.

40. The package according to claim 39, wherein the channels taper at an angle of approximately 2 –3°, relative to parallel.

* * * * *